United States Patent
Pang et al.

(10) Patent No.: US 11,476,164 B2
(45) Date of Patent: Oct. 18, 2022

(54) INTEGRATED CIRCUIT STRUCTURES HAVING DIFFERENTIATED WORKFUNCTION LAYERS

(71) Applicant: Intel Corporation, Santa Clara, CA (US)

(72) Inventors: Ying Pang, Portland, OR (US); Florian Gstrein, Portland, OR (US); Dan S. Lavric, Beaverton, OR (US); Ashish Agrawal, Portland, OR (US); Robert Niffenegger, Hillsboro, OR (US); Padmanava Sadhukhan, Hillsboro, OR (US); Robert W. Heussner, Portland, OR (US); Joel M. Gregie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 16/631,352

(22) PCT Filed: Sep. 26, 2017

(86) PCT No.: PCT/US2017/053430
§ 371 (c)(1),
(2) Date: Jan. 15, 2020

(87) PCT Pub. No.: WO2019/066775
PCT Pub. Date: Apr. 4, 2019

(65) Prior Publication Data
US 2020/0219775 A1   Jul. 9, 2020

(51) Int. Cl.
*H01L 27/092* (2006.01)
*H01L 21/8238* (2006.01)
*H01L 29/66* (2006.01)

(52) U.S. Cl.
CPC ........ *H01L 21/823821* (2013.01); *H01L 21/823842* (2013.01); *H01L 27/0924* (2013.01); *H01L 29/66545* (2013.01); *H01L 29/66795* (2013.01)

(58) Field of Classification Search
None
See application file for complete search history.

(56) References Cited

U.S. PATENT DOCUMENTS 8,304,841 B2   11/2012   Xu et al.
9,318,389 B1   4/2016    Yang et al.
(Continued)

OTHER PUBLICATIONS

International Search Report and Written Opinion for International Patent Application No. PCT/US2017/053430 dated May 23, 2018, 13 pgs.
(Continued)

*Primary Examiner* — Joseph C. Nicely
*Assistant Examiner* — Lamont B Koo
(74) *Attorney, Agent, or Firm* — Schwabe, Williamson & Wyatt P.C.

(57) ABSTRACT

Integrated circuit structures having differentiated workfunction layers are described. In an example, an integrated circuit structure includes a first gate electrode above a substrate. The first gate electrode includes a first workfunction material layer. A second gate electrode is above the substrate. The second gate electrode includes a second workfunction material layer different in composition from the first workfunction material layer. The second gate electrode does not include the first workfunction material layer, and the first gate electrode does not include the second workfunction material layer. A third gate electrode above is the substrate. The third gate electrode includes a third workfunction material layer different in composition from the first workfunction material layer and the second workfunction mate-
(Continued)

rial layer. The third gate electrode does not include the first workfunction material layer and does not include the second workfunction material layer.

19 Claims, 8 Drawing Sheets

(56) References Cited

U.S. PATENT DOCUMENTS

| | | |
|---|---|---|
| 9,698,241 B1 | 7/2017 | Patil et al. |
| 2005/0006711 A1 | 1/2005 | Rotondaro et al. |
| 2014/0319626 A1 | 10/2014 | Jangjian et al. |
| 2016/0358921 A1* | 12/2016 | Park ................ H01L 21/823842 |

OTHER PUBLICATIONS

International Preliminary Report on Patentability for International Patent Application No. PCT/US2017/053430 dated Apr. 9, 2020, 10 pgs.

* cited by examiner

PLAN VIEW 600

CROSS-SECTIONAL VIEWS

INTEGRATED CIRCUIT STRUCTURES HAVING DIFFERENTIATED WORKFUNCTION LAYERS

CROSS-REFERENCE TO RELATED APPLICATION

This patent application is a U.S. National Phase Application under 35 U.S.C. § 371 of International Application No. PCT/US2017/053430, filed Sep. 26, 2017, entitled "INTEGRATED CIRCUIT STRUCTURES HAVING DIFFERENTIATED WORKFUNCTION LAYERS," which designates the United States of America, the entire disclosure of which is hereby incorporated by reference in its entirety and for all purposes.

TECHNICAL FIELD

Embodiments of the disclosure are in the field of integrated circuit structures and, in particular, integrated circuit structures having differentiated workfunction layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
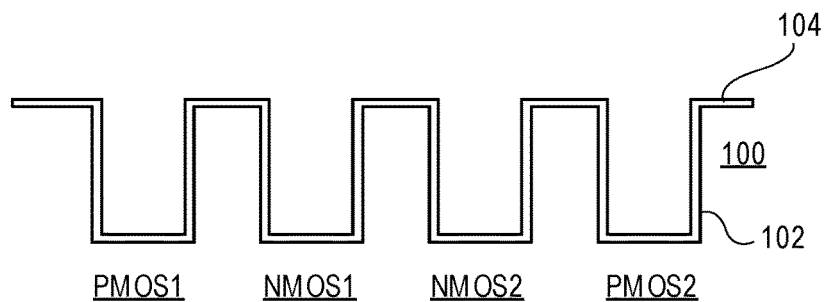
FIGS. 1A-1D illustrate cross-sectional views of various operations in a method of fabricating an integrated circuit structure.

Integrated circuit structures having differentiated workfunction layers are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to customized device process integration approaches. Embodiments may be directed toward the fabrication of integrated circuit structures have gate electrodes with differentiated workfunction values. Embodiments may be directed toward complementary metal oxide semiconductor (CMOS) integration. Embodiments may be applicable to 7 nanometer technology nodes and smaller. Embodiments may be directed to metal gate processing.

To provide context, very large scale integrated (VLSI) chips with complex integrated circuits today are often referred as a system-on-chip (SoC). SoCs can include numeric classes of analog, digital, and mixed-signal functions on a single silicon (Si) substrate. To fabricate such complicated circuits with Si CMOS transistor technology, many processing operations are often involved including photolithography, chemical reaction and thin film deposition. State-of-the-art approaches for constructing such circuits are typically based on conventional approaches previously used for much simpler circuit design, and can involve the use of blanket single materials or thin films deposited on an Si substrate to form a transistor structure. Conventional approaches typically involve removal of non-desired materials through photolithography followed by additional operations used to fill with a desired material.

In one or more embodiments described herein, a high temperature carbon-based hardmask (HTCHM) is used for lithographic patterning which allows materials or thin films to be deposited after each device is patterned. Using this approach, each device effectively receives its own exclusive processing. Since the need to remove undesirable thin films and re-deposit desirable thin films is dispensed with, approaches described herein may be viewed as a cleaner processing technology for fabricating transistor structures.

Embodiments described herein may be implemented for one or more of the following applications: (a) the opportunity to deposit different types of workfunction metal (WFM) films to construct different types of transistors, (b) the opportunity to deposit different thicknesses of gate workfunction WFM films to achieve different threshold voltages, (c) the opportunity to fill different materials in isolation plug trenches of metal gates or metal contacts, or (d) the opportunity to deposit different dielectric materials in transistor MOS capacitors for different devices which having differing requirements in leakage.

To provide further context, in conventional multi-VT integration schemes, remaining PMOS WFM is included in an NMOS device or vice versa. This can lead to significant VT elevation. In one or more embodiments described herein, a PMOS WFM film is not deposited in an NMOS gate trench. That is, the VT of each device is set by its own WFM uniquely. In one or more embodiments, new architectures are achievable for muti-Vt CMOS devices. Such devices may be composed of different WFM materials in different devices based on application need. Each device may have different gate stacks, which may even include differing gate dielectric materials or thicknesses as well. In one or more embodiments, gate of poly critical dimension (CD) is preserved since spacer erosion is mitigated as the HTCHM covers non-selected gate locations during WFM recesses for selected gate locations.

It is to be appreciated that commonly used integration schemes employed to create multi-VTs devices involves depositing a blanket PMOS WFM film across all devices, and then removing PMOS WFM from NMOS devices through lithographic pattering. To provide illustrative context of a conventional processing scheme, FIGS. 1A-1D illustrate cross-sectional views of various operations in a method of fabricating an integrated circuit structure.

Referring to FIG. 1A, a first workfunction material layer 104 is formed in a plurality of gate trenches 102 in a dielectric layer 100.

Figure 1B:
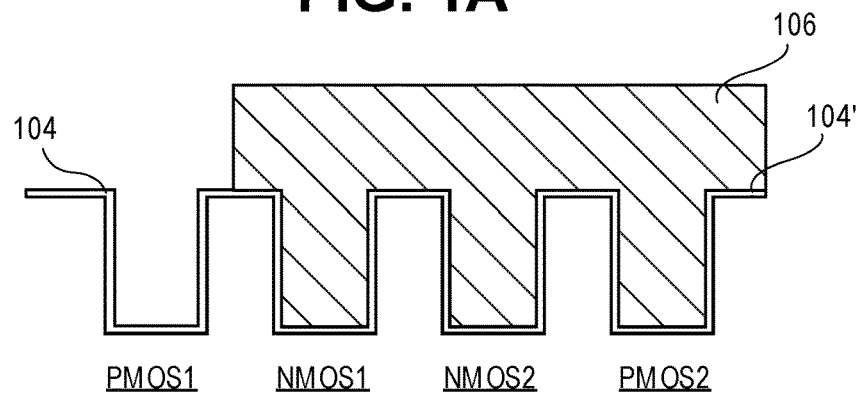

Referring to FIG. 1B, a mask is formed over the first workfunction material layer 104 in the plurality of gate trenches 102. The mask 106 exposes a first of the plurality of gate trenches 102 (far left trench) and covers remaining ones of the plurality of gate trenches 102.

Figure 1C:
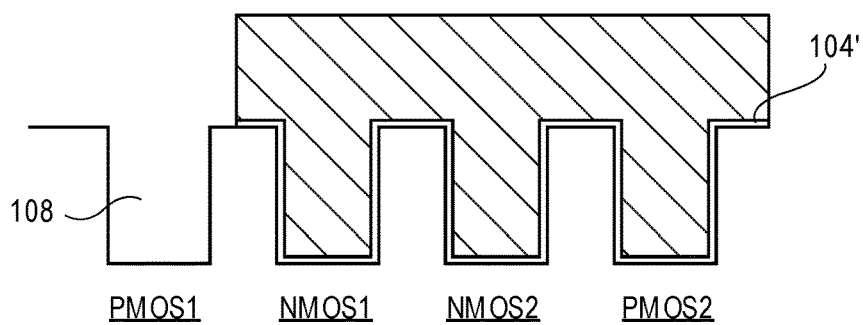

Referring to FIG. 1C, the workfunction material layer 104 in and near the first of the plurality of gate trenches is removed, e.g., by an etch process, to leaved cleared trench 108 and remaining portion 104' of the workfunction material layer 104.

Figure 1D:
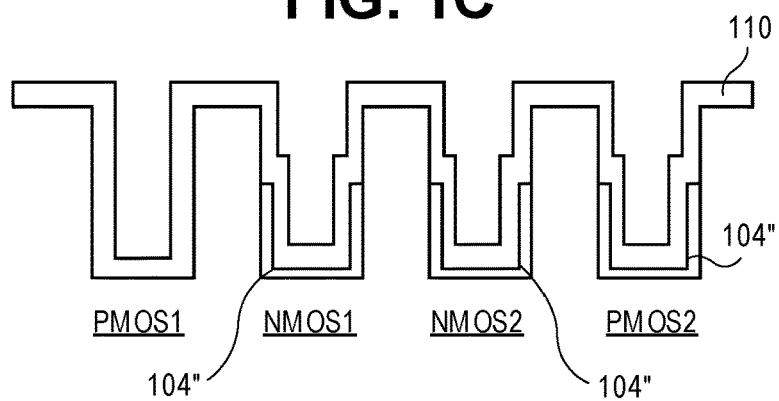

Referring to FIG. 1D, the mask 106 is removed and the remaining portion 104' of the workfunction material layer 104 is recessed within the trenches 102 to form workfunction layers 104". A second workfucntion material layer 110 is then formed in the plurality of gate trenches 102. Subsequent processing may then involve confining the second workfucntion material layer 110 within the trenches 102. Noteworthy is that, in such a processing scheme, all of the gate trenches 102 ultimately include a portion of the second workfucntion material layer 110.

In contrast to FIGS. 1A-1D, integration schemes described herein allow for each gate location to receive its own processing. The process may be repeated until each type of device is filled with a corresponding WFM. In an exemplary such processing scheme, FIGS. 2A-2E illustrate cross-sectional views of various operations in a method of fabricating an integrated circuit structure having differentiated workfunction layers, in accordance with an embodiment of the present disclosure.

Figure 2A:
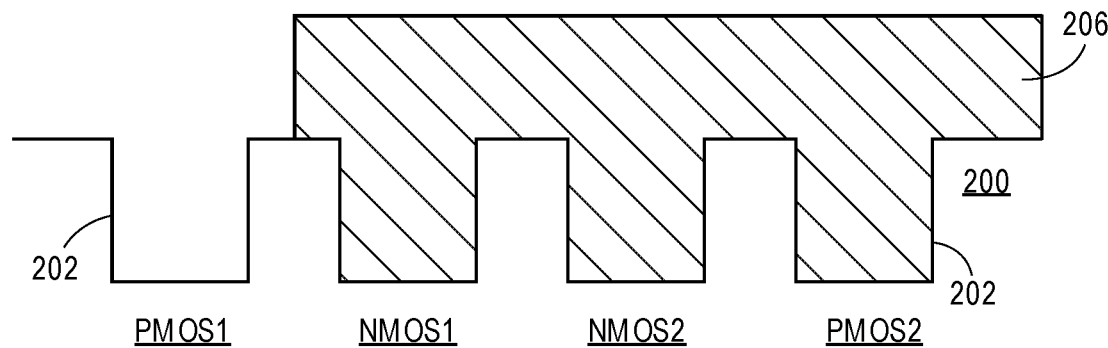
FIGS. 2A-2E illustrate cross-sectional views of various operations in a method of fabricating an integrated circuit structure having differentiated workfunction layers, in accordance with an embodiment of the present disclosure.

Referring to FIG. 2A, a method of fabricating an integrated circuit structure includes forming a plurality of gate trenches 202 in a dielectric layer 200 above a substrate. A first mask 206 is formed over the plurality of gate trenches 202. The first mask 206 exposes a first (far left trench) of the plurality of gate trenches 202 and covers remaining ones of the plurality of gate trenches 202. In an embodiment, the first mask 206 is a carbon-based hardmask. Although not depicted, in an embodiment, prior to forming the first mask 206, a gate dielectric layer is formed in the plurality of gate trenches 202.

Figure 2B:
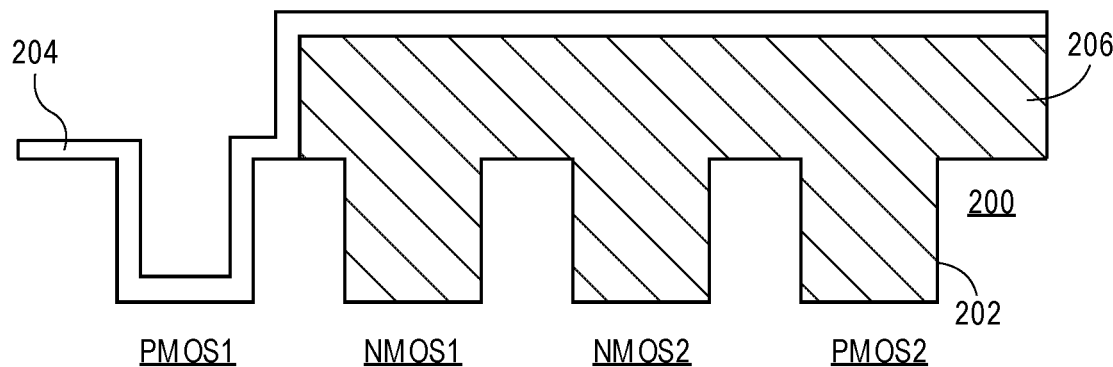

Referring to FIG. 2B, a first workfunction material layer 204 is formed in the first (far left) of the plurality of gate trenches 202 and over the first mask 206.

Figure 2C:
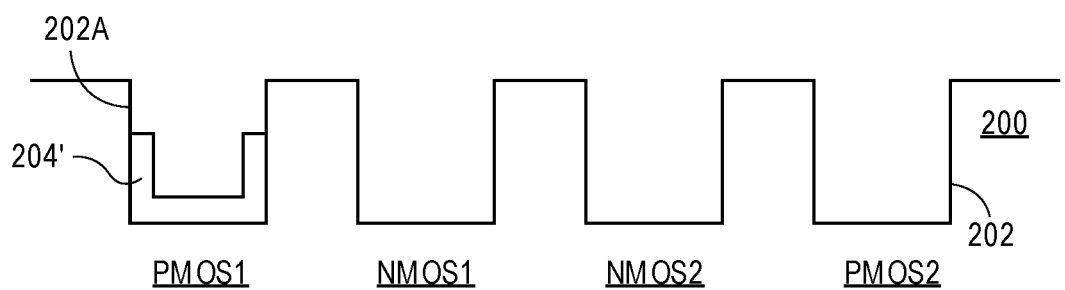

Referring to FIG. 2C, a sacrificial portion of the first workfunction material layer 204 is removed and the first mask 206 is removed to leave a remaining portion 204' of the first workfunction material layer 204 in the first 202A of the plurality of gate trenches 202.

Figure 2D:
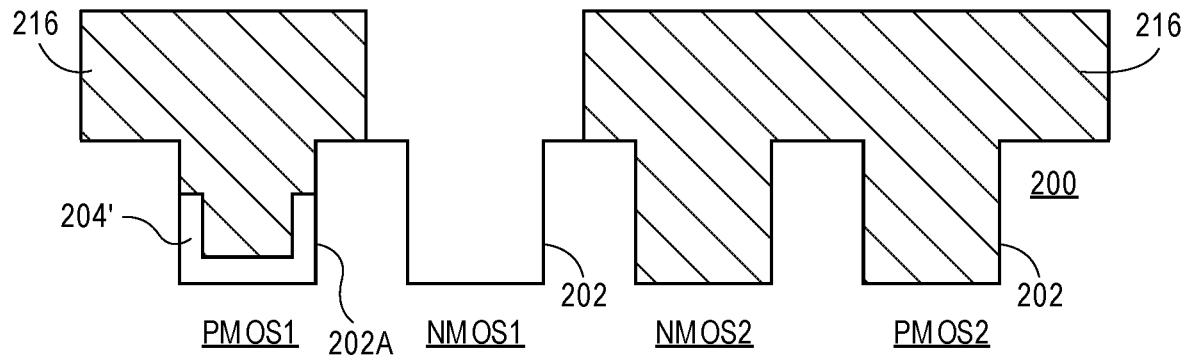

Referring to FIG. 2D, a second mask 216 is then formed over the plurality of gate trenches 202. The second mask 216 exposes a second (next in from far left) of the plurality of gate trenches 202 and covers remaining ones of the plurality of gate trenches 202, including already-processes gate trench 202A. In an embodiment, the second mask 206 is a carbon-based hardmask.

Figure 2E:
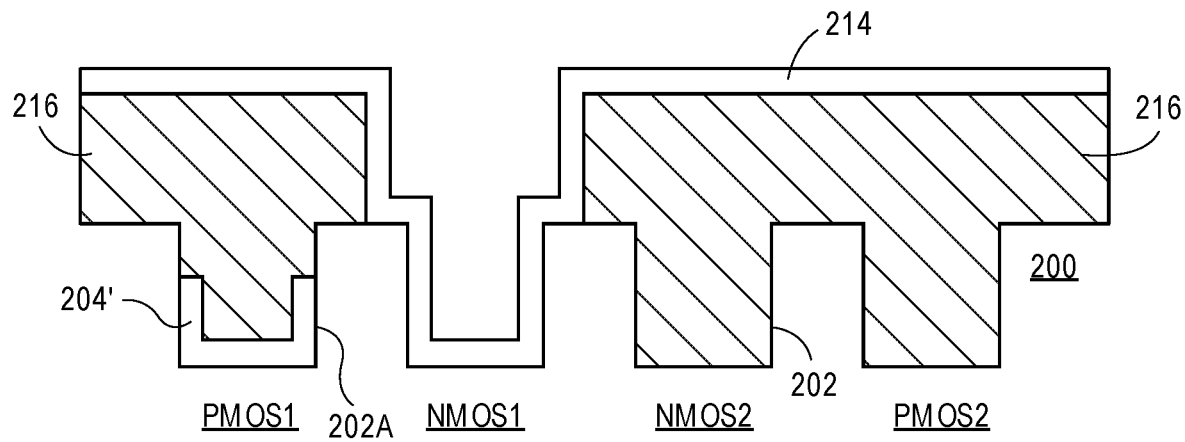

Referring to FIG. 2E, a second workfunction material layer 214 is formed in the second of the plurality of gate trenches 202 and over the second mask 216. As shown for trench 202B of FIG. 3, a sacrificial portion of the second workfunction material layer 214 is then removed and the second mask 216 is removed to leave a remaining portion 214' of the second workfunction material layer 214 in the second 214B of the plurality of gate trenches 202. In an embodiment, although not depicted, subsequent to removing the sacrificial portion of the second workfunction material layer 214 and removing the second mask 216, a conductive fill material is formed in the plurality of gate trenches 202.

Figure 3:
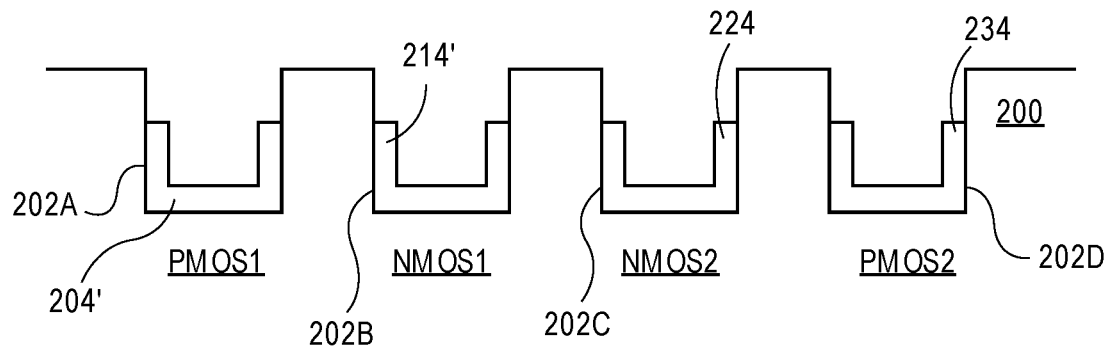
FIG. 3 illustrates a cross-sectional view of an integrated circuit structure having differentiated workfunction layers, in accordance with an embodiment of the present disclosure.

In an embodiment, as exemplified in FIG. 3, subsequent to removing the sacrificial portion of the second workfunction material layer 214 and removing the second mask 216, a third mask is formed over the plurality of gate trenches 202. The third mask exposes a third (202C) of the plurality of gate trenches and covers remaining ones of the plurality of gate trenches 202. A third workfunction material layer is formed in the third 202C of the plurality of gate trenches 202 and over the third mask. A sacrificial portion of the third workfunction material layer and the third mask are removed to leave a remaining portion (e.g., 224) of the third workfunction material layer in the third (202C) of the plurality of gate trenches 202.

FIG. 3 illustrates a cross-sectional view of an integrated circuit structure having differentiated workfunction layers, in accordance with an embodiment of the present disclosure.

Referring to FIG. 3, an integrated circuit structure includes a first gate electrode (e.g., in trench 202A) above a substrate. The first gate electrode includes a first workfunction material layer 204'. A second gate electrode (e.g., in trench 202B) is above the substrate. The second gate electrode includes a second workfunction material layer 214' different in composition from the first workfunction material layer 204'. The second gate electrode does not include the first workfunction material layer 204', and the first gate electrode does not include the second workfunction material layer 214'. A third gate electrode (e.g., in trench 202C) above is the substrate. The third gate electrode includes a third workfunction material layer 224 different in composition from the first workfunction material layer 204' and the second workfunction material layer 214'. The third gate electrode does not include the first workfunction material layer 204' and does not include the second workfunction material layer 214. The first and second gate electrodes do not include the third workfunction material layer 224.

In an embodiment, the first workfunction material layer 204' is a P-type workfunction material layer, the second workfunction material layer 214' is an N-type workfunction material layer, and the third workfunction material layer 224 is an N-type workfunction material layer, as is depicted. In another embodiment, the first workfunction material layer 204' is a P-type workfunction material layer, the second workfunction material layer 214' is a P-type workfunction material layer, and the third workfunction material layer 224 is an N-type workfunction material layer. In another embodiment, all of the first workfunction material layer 204', the second workfunction material layer 214' and the third workfunction material layer 224 are N-type workfunction material layers. In yet another embodiment, all of the first workfunction material layer 204', the second workfunction material layer 214' and the third workfunction material layer 224 are P-type workfunction material layers.

In an embodiment, as is described in greater detail below, a common conductive fill material is included above the first workfunction material layer 204', above the second workfunction material layer 214', and above the third workfunction material layer 224. In an embodiment, as is also described in greater detail below, a common gate dielectric layer is included below the first workfunction material layer 204', below the second workfunction material layer 214', and below the third workfunction material layer 224.

Referring again to FIG. 3, in an embodiment, the integrated circuit structure further includes a fourth gate electrode (e.g., in trench 202D) above the substrate. The fourth gate electrode has a fourth workfunction material layer 234 different in composition from that first workfunction material layer 204', the second workfunction material layer 214' and the third workfunction material layer 224. The fourth gate electrode does not include the first workfunction material layer 204', does not include the second workfunction material layer 214', and does not include the third workfunction material layer 224.

Figure 4:
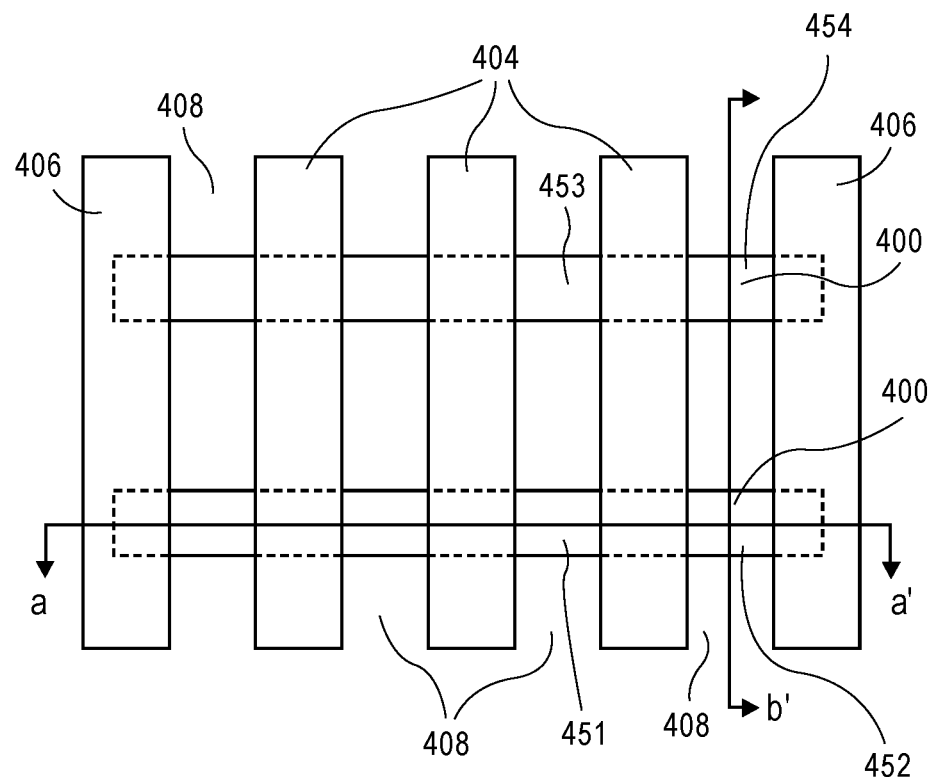
FIG. 4 illustrates a plan view of a plurality of gate lines over a pair of semiconductor fins, in accordance with an embodiment of the present disclosure.

FIG. 4 illustrates a plan view of a plurality of gate lines over a pair of semiconductor fins, in accordance with another embodiment of the present disclosure.

Referring to FIG. 4, a plurality of active gate lines 404 is formed over a plurality of semiconductor fins 400. Dummy gate lines 406 are at the ends of the plurality of semiconductor fins 400. Spacings 408 between the gate lines 404/406 are locations where trench contacts may be located to provide conductive contacts to source/drain regions, such as source/drain regions 451, 452, 453, and 454.

In an embodiment, the pattern of the plurality of gate lines 404/406 and/or the pattern of the plurality of semiconductor fins 400 is described as a grating structure. In an embodiment, the term "grating" for the plurality of gate lines 404/406 and/or the pattern of the plurality of semiconductor fins 400 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 404/406 and/or the pattern of the plurality of semiconductor fins 400 spaced at a constant pitch and having a constant width. The pattern may be fabricated by a pitch halving or pitch quartering, or other pitch division, approach.

Figure 5:
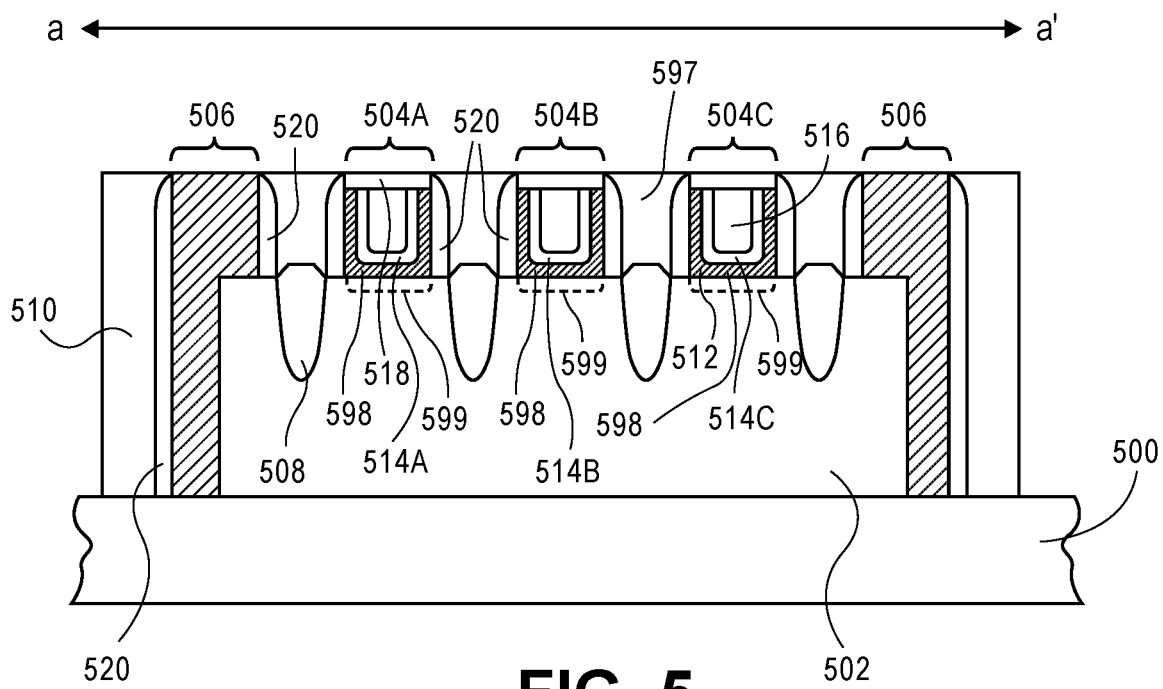
FIG. 5 illustrates a cross-sectional view, taken along the a-a' axis of FIG. 4, in accordance with an embodiment of the present disclosure.

FIG. 5 illustrates a cross-sectional view, taken along the a-a' axis of FIG. 4, in accordance with an embodiment of the present disclosure.

Referring to FIG. 5, a plurality of active gate lines 504A, 504B, 504C is formed over a semiconductor fin 502 formed above a substrate 500. Dummy gate lines 506 are at the ends of the semiconductor fin 502. A dielectric layer 510 is outside of the dummy gate lines 506. A trench contact material 597 is between the active gate lines 504A, 504B, 504C, and between the dummy gate lines 506 and the active gate lines 504A, 504B, 504C. Embedded source/drain structures 508 are in the semiconductor fin 502 between the active gate lines 504A, 504B, 504C and between the dummy gate lines 506 and the active gate lines 504A, 504B, 504C.

The active gate lines 504 include a gate dielectric structure 512, a workfunction gate electrode portion 514A, 514B or 514C and a fill gate electrode portion 516 (where the fill gate electrode may be common to all active gate lines 504A, 504B, 504C), and a dielectric capping layer 518. Dielectric spacers 520 line the sidewalls of the active gate lines 504A, 504B, 504C and the dummy gate lines 506. In an embodiment, the gate dielectric structure 512 includes a high-k dielectric layer 598, which may be common to all active gate lines 504A, 504B, 504C. In one embodiment, the gate dielectric structure 512 further includes an amorphous oxide layer 599.

With reference generally to FIGS. 4 and 5, in accordance with an embodiment of the present disclosure, an integrated circuit structure includes a first gate electrode 504A over a top and sidewalls of a semiconductor fin 502. The first gate electrode 504A includes a first workfunction material layer 514A. A second gate electrode 504B is over the top and sidewalls of the semiconductor fin 502. The second gate electrode 504B includes a second workfunction material layer 514B different in composition from the first workfunction material layer 514A. The second gate electrode 504B does not include the first workfunction material layer 514A, and the first gate electrode 504A does not include the second workfunction material layer 514B.

In an embodiment, the first workfunction material layer 514A and the second workfunction material layer 514B are N-type workfunction material layers. In another embodiment, the first workfunction material layer 514A and the second workfunction material layer 514B are P-type workfunction material layers. In another embodiment, the first workfunction material layer 514A is a P-type workfunction material layer, and the second workfunction material layer 514B is an N-type workfunction material layer.

In an embodiment, the integrated circuit structure further includes a common conductive fill material 516 above the first workfunction material layer 514A, and above the second workfunction material layer 514B. In an embodiment, the integrated circuit structure further includes a common gate dielectric layer 588 (or 598/599) below the first workfunction material layer 514A, and below the second workfunction material layer 514B.

In an embodiment, the integrated circuit structure further includes a third gate electrode 504C over the top and sidewalls of the semiconductor fin 502. The third gate electrode 504C includes a third workfunction material layer 514C different in composition from the first workfunction material layer 514A and different from the second workfunction material layer 514B. In one embodiment, the third gate electrode 504C does not include the first workfunction material layer 514A and does not include the second workfunction material layer 514B.

Figure 6:
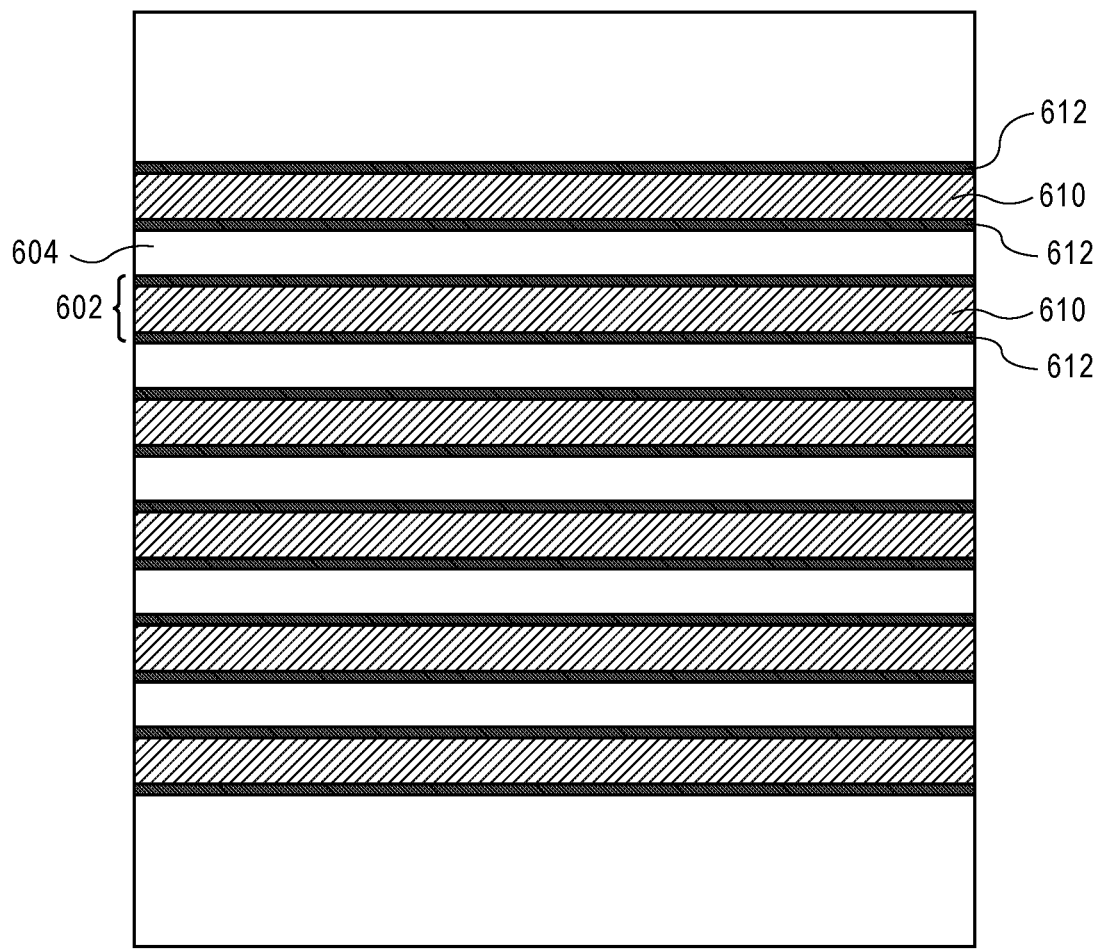
FIG. 6 illustrates a plan view and corresponding cross-sectional view of a metallization layer of an integrated circuit structure, in accordance with an embodiment of the present disclosure.
Figure 6:
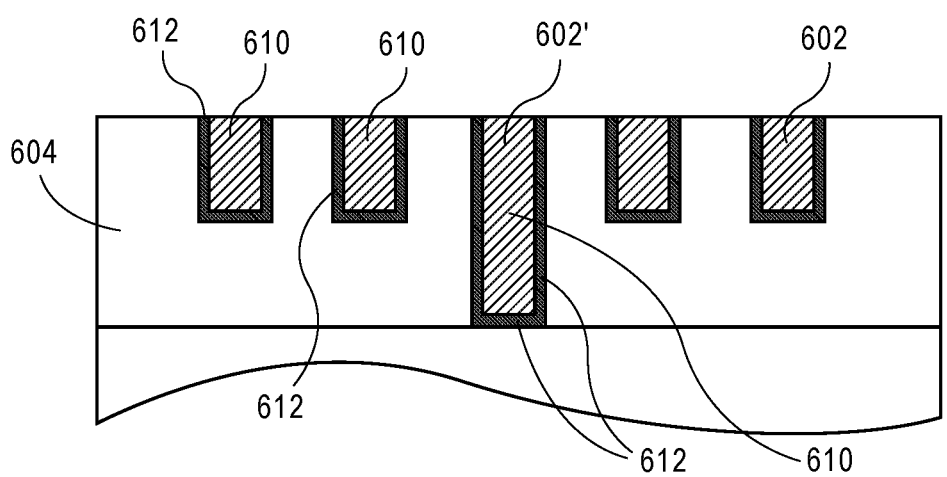

FIG. 6 illustrates a plan view and corresponding cross-sectional view of a metallization layer of an integrated circuit structure that may be fabricated above and may interconnect integrated circuit structures having differentiated workfunction layers, in accordance with an embodiment of the present disclosure.

Referring to FIG. 6, a metallization layer 600 includes a pattern of conductive lines 602 and interlayer dielectric (ILD) lines 604. The metallization layer 600 may be patterned in a grating-like pattern with conductive lines 602 spaced at a constant pitch and having a constant width, as is depicted in FIG. 6. Although not shown, the conductive lines 602 may have interruptions (i.e., cuts or plugs) at various locations along the lines. Some of the conductive lines may be associated with underlying vias, such as line 602' shown as an example in the cross-sectional view.

In an embodiment, the term "grating" for conductive lines 602 and ILD lines 604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 602 and/or ILD lines 604 spaced at a constant pitch and having a constant width. The pattern may be fabricated by a pitch halving or pitch quartering, or other pitch division, approach.

In an embodiment, the conductive lines 602 (and, possibly, underlying via structures) are composed of one or more metal or other conductive structures. The conductive lines 602 are also sometimes referred to in the art as traces, wires, lines, metal, interconnect lines or simply interconnects. In a particular embodiment, each of the conductive lines 602 includes a barrier layer 612 and a conductive fill material 610. In an embodiment, the barrier layer 612 is a titanium nitride or tantalum nitride barrier layer. In an embodiment, the conductive fill material 610 is composed of a conductive material such as, but not limited to, Cu, Al, Ti, Zr, Hf, V, Ru, Co, Ni, Pd, Pt, W, Ag, Au or alloys thereof.

In an embodiment, ILD lines 604 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 6 may be fabricated on underlying lower level back end of line (BEOL) interconnect layers.

Figure 7A:
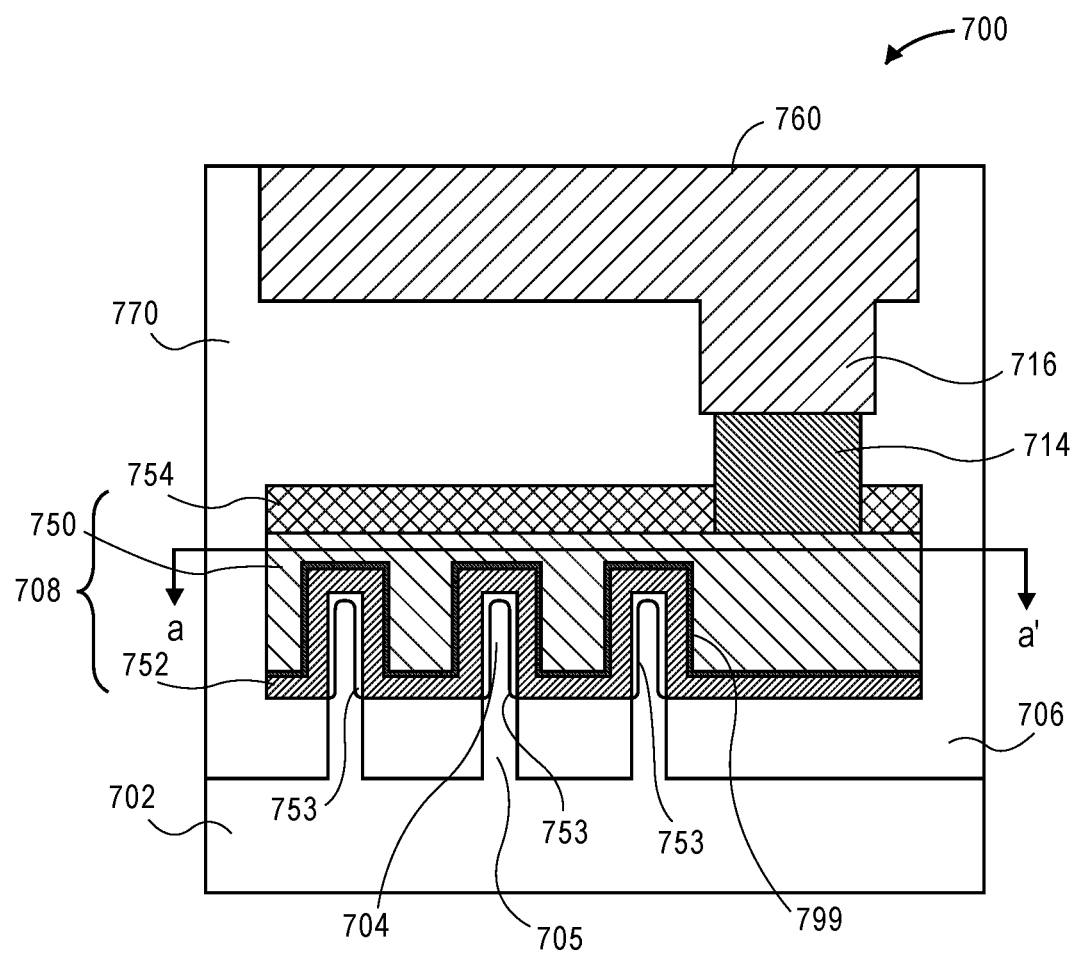
FIG. 7A illustrates a cross-sectional view of a non-planar semiconductor device, in accordance with an embodiment of the present disclosure.
Figure 7B:
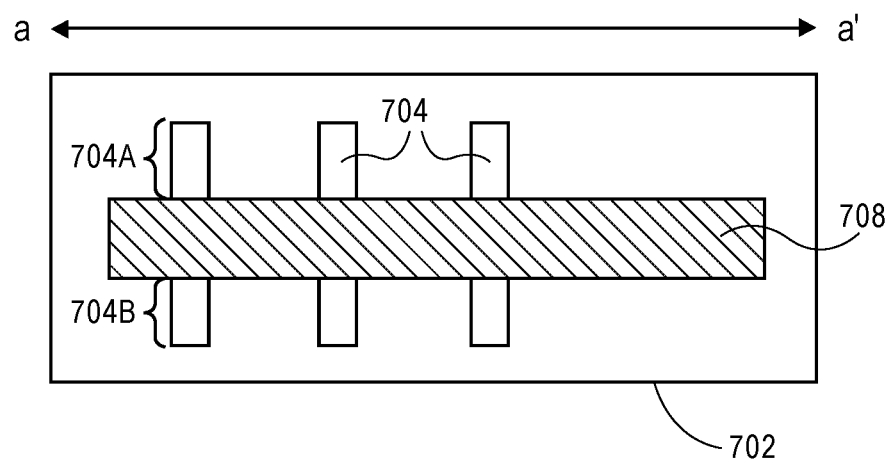
FIG. 7B illustrates a plan view taken along the a-a' axis of the semiconductor device of FIG. 7A, in accordance with an embodiment of the present disclosure.

One or more embodiments described herein are directed to fabricating semiconductor devices, such as for metal oxide semiconductor (MOS) device fabrication. As an example, FIG. 7A illustrates a cross-sectional view of a non-planar semiconductor device. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750/799 and a gate dielectric structure 752/753. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, antimony, boron, gallium or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon monocrystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

In an embodiment, the gate dielectric layer 752 is composed of a high-K material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide 753 formed from the top few layers of the substrate 702. In an embodiment, the gate dielectric layer is composed of a top high-k portion and a lower portion composed of an oxide of a semiconductor material. In one embodiment, the gate dielectric layer is composed of a top portion 753 of hafnium oxide and a bottom portion 753 of silicon dioxide or silicon oxy-nitride. In some implementations, the gate dielectric layer 752 may consist of a "U"-shaped structure that includes a bottom portion substantially parallel to the surface of the substrate and two sidewall portions that are substantially perpendicular to the top surface of the substrate.

In an embodiment, layer 750 of the gate electrode 750/799 is composed of a non-workfunction-setting conductive fill material formed above a workfunction-setting layer 799. In one such embodiment, the conductive fill material 750 includes a material such as but not limited to, tungsten (W), aluminum (Al), or copper (Cu). For a PMOS transistor, metals that may be used for the workfunction-setting layer 799 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the workfunction-setting layer 799 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the workfunction-setting layer 799 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 754 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 754 and/or dielectric spacers are composed of a dielectric material such as, but not limited to, silicon dioxide, silicon oxy-nitride, silicon nitride, or carbon-doped silicon nitride.

Gate contact 714, overlying gate contact via 716, and/or overlying metal interconnect 760 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 714, overlying gate contact via 716, or overlying metal interconnect 760 includes a barrier layer and a conductive fill material. In one such embodiment, the barrier layer is a tantalum nitride layer or a titanium nitride layer. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of SF6. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
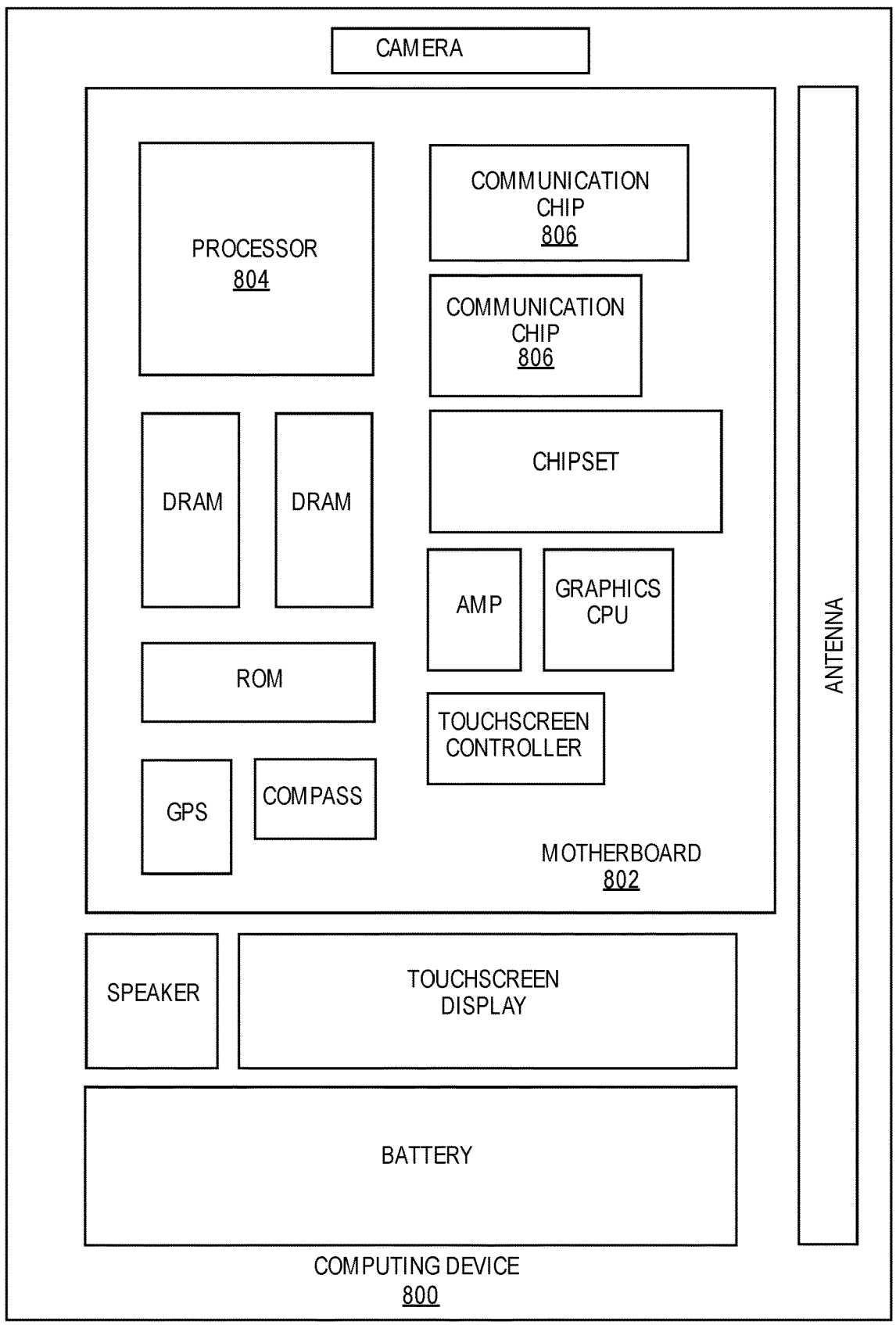
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes integrated circuit structures having differentiated workfunction layers, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes integrated circuit structures having differentiated workfunction layers, in accordance with implementations of embodiments of the disclosure.

In further implementations, another component housed within the computing device 800 may contain integrated circuit structures having differentiated workfunction layers, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
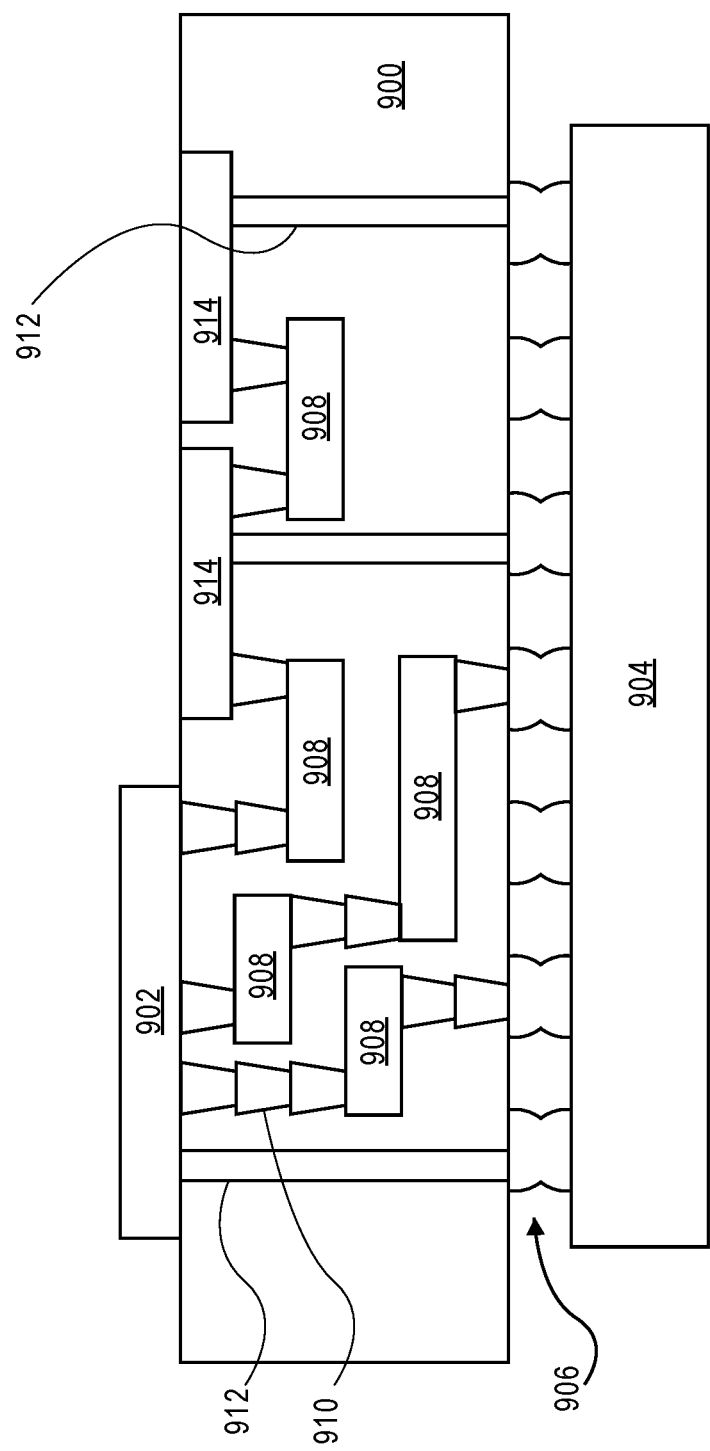
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments described herein include integrated circuit structures having differentiated workfunction layers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first gate electrode above a substrate. The first gate electrode includes a first workfunction material layer. A second gate electrode is above the substrate. The second gate electrode includes a second workfunction material layer different in composition from the first workfunction material layer. The second gate electrode does not include the first workfunction material layer, and the first gate electrode does not include the second workfunction material layer. A third gate electrode above is the substrate. The third gate electrode includes a third workfunction material layer different in composition from the first workfunction material layer and the second workfunction material layer. The third gate electrode does not include the first workfunction material layer and does not include the second workfunction material layer, and the first and second gate electrodes do not include the third workfunction material layer.

Example embodiment 2: The integrated circuit structure of example embodiment 1, wherein the first workfunction material layer is a P-type workfunction material layer, the second workfunction material layer is an N-type workfunction material layer, and the third workfunction material layer is an N-type workfunction material layer.

Example embodiment 3: The integrated circuit structure of example embodiment 1, wherein the first workfunction material layer is a P-type workfunction material layer, the second workfunction material layer is a P-type workfunction material layer, and the third workfunction material layer is an N-type workfunction material layer.

Example embodiment 4: The integrated circuit structure of example embodiment 1, wherein the all of the first workfunction material layer, the second workfunction material layer and the third workfunction material layer are N-type workfunction material layers.

Example embodiment 5: The integrated circuit structure of example embodiment 1, wherein the all of the first workfunction material layer, the second workfunction material layer and the third workfunction material layer are P-type workfunction material layers.

Example embodiment 6: The integrated circuit structure of example embodiment 1, 2, 3, 4 or 5, further including a fourth gate electrode above the substrate, the fourth gate electrode having a fourth workfunction material layer different in composition from that first workfunction material layer, the second workfunction material layer and the third workfunction material layer, wherein the fourth gate electrode does not include the first workfunction material layer, does not include the second workfunction material layer, and does not include the third workfunction material layer.

Example embodiment 7: The integrated circuit structure of example embodiment 1, 2, 3, 4, 5 or 6, further including a common conductive fill material above the first workfunction material layer, above the second workfunction material layer, and above the third workfunction material layer.

Example embodiment 8: The integrated circuit structure of example embodiment 1, 2, 3, 4, 5, 6 or 7, further including a common gate dielectric layer below the first workfunction material layer, below the second workfunction material layer, and below the third workfunction material layer.

Example embodiment 9: A method of fabricating an integrated circuit structure includes forming a plurality of gate trenches in a dielectric layer above a substrate. A first mask is formed over the plurality of gate trenches, the first mask exposing a first of the plurality of gate trenches and covering remaining ones of the plurality of gate trenches. A first workfunction material layer is formed in the first of the plurality of gate trenches and over the first mask. A sacrificial portion of the first workfunction material layer is removed and the first mask is removed to leave a remaining portion of the first workfunction material layer in the first of the plurality of gate trenches. A second mask is formed over the plurality of gate trenches, the second mask exposing a second of the plurality of gate trenches and covering remaining ones of the plurality of gate trenches. A second workfunction material layer is formed in the second of the plurality of gate trenches and over the second mask. A sacrificial portion of the second workfunction material layer is removed and the second mask is removed to leave a remaining portion of the second workfunction material layer in the second of the plurality of gate trenches.

Example embodiment 10: The method of example embodiment 9, wherein forming the first and second masks involves forming first and second carbon-based hardmasks.

Example embodiment 11: The method of example embodiment 9 or 10, further including, prior to forming the first mask, forming a gate dielectric layer in the plurality of gate trenches.

Example embodiment 12: The method of example embodiment 9, 10 or 11, further including, subsequent to removing the sacrificial portion of the second workfunction material layer and removing the second mask, forming a conductive fill material in the plurality of gate trenches.

Example embodiment 13: The method of example embodiment 9, 10, 11 or 12, further including, subsequent to removing the sacrificial portion of the second workfunction material layer and removing the second mask, forming a third mask over the plurality of gate trenches, the third mask exposing a third of the plurality of gate trenches and covering remaining ones of the plurality of gate trenches, forming a third workfunction material layer in the third of the plurality of gate trenches and over the third mask, and removing a sacrificial portion of the third workfunction material layer and removing the third mask to leave a remaining portion of the third workfunction material layer in the third of the plurality of gate trenches.

Example embodiment 14: An integrated circuit structure includes a first gate electrode over a top and sidewalls of a semiconductor fin, the first gate electrode including a first workfunction material layer. A second gate electrode is over the top and sidewalls of the semiconductor fin, the second gate electrode including a second workfunction material layer different in composition from the first workfunction material layer. The second gate electrode does not include the first workfunction material layer, and the first gate electrode does not include the second workfunction material layer.

Example embodiment 15: The integrated circuit structure of example embodiment 14, wherein the first workfunction material layer and the second workfunction material layer are N-type workfunction material layers.

Example embodiment 16: The integrated circuit structure of example embodiment 14, wherein the first workfunction material layer and the second workfunction material layer are P-type workfunction material layers.

Example embodiment 17: The integrated circuit structure of example embodiment 14, wherein the first workfunction material layer is a P-type workfunction material layer, and the second workfunction material layer is an N-type workfunction material layer.

Example embodiment 18: The integrated circuit structure of example embodiment 14, 15, 16 or 17, further including a third gate electrode over the top and sidewalls of the semiconductor fin, the third gate electrode including a third workfunction material layer different in composition from the first workfunction material layer and different from the second workfunction material layer.

Example embodiment 19: The integrated circuit structure of example embodiment 14, 15, 16, 17 or 18, further including a common conductive fill material above the first workfunction material layer, and above the second workfunction material layer.

Example embodiment 20: The integrated circuit structure of example embodiment 14, 15, 16, 17, 18 or 19, further including a common gate dielectric layer below the first workfunction material layer, and below the second workfunction material layer.

What is claimed is:

1. An integrated circuit structure, comprising:
   a first gate electrode above a substrate, the first gate electrode comprising a first workfunction material layer;
   a second gate electrode above the substrate, the second gate electrode comprising a second workfunction material layer different in composition from the first workfunction material layer, wherein the second gate electrode does not include the first workfunction material layer, and wherein the first gate electrode does not include the second workfunction material layer; and
   a third gate electrode above the substrate, the third gate electrode comprising a third workfunction material layer different in composition from the first workfunction material layer and the second workfunction material layer, wherein the third gate electrode does not include the first workfunction material layer and does not include the second workfunction material layer, and wherein the first and second gate electrodes do not include the third workfunction material layer.

2. The integrated circuit structure of claim 1, wherein the first workfunction material layer is a P-type workfunction material layer, the second workfunction material layer is an N-type workfunction material layer, and the third workfunction material layer is an N-type workfunction material layer.

3. The integrated circuit structure of claim 1, wherein the first workfunction material layer is a P-type workfunction material layer, the second workfunction material layer is a P-type workfunction material layer, and the third workfunction material layer is an N-type workfunction material layer.

4. The integrated circuit structure of claim 1, wherein the all of the first workfunction material layer, the second workfunction material layer and the third workfunction material layer are N-type workfunction material layers.

5. The integrated circuit structure of claim 1, wherein the all of the first workfunction material layer, the second workfunction material layer and the third workfunction material layer are P-type workfunction material layers.

6. The integrated circuit structure of claim 1, further comprising:
   a fourth gate electrode above the substrate, the fourth gate electrode comprising a fourth workfunction material layer different in composition from that first workfunction material layer, the second workfunction material layer and the third workfunction material layer, wherein the fourth gate electrode does not include the first workfunction material layer, does not include the second workfunction material layer, and does not include the third workfunction material layer.

7. The integrated circuit structure of claim 1, further comprising:
   a common conductive fill material above the first workfunction material layer, above the second workfunction material layer, and above the third workfunction material layer.

8. The integrated circuit structure of claim 1, further comprising:
   a common gate dielectric layer below the first workfunction material layer, below the second workfunction material layer, and below the third workfunction material layer.

9. A method of fabricating an integrated circuit structure, the method comprising:
   forming a plurality of gate trenches in a dielectric layer above a substrate;
   forming a first mask over the plurality of gate trenches, the first mask exposing a first of the plurality of gate trenches and covering remaining ones of the plurality of gate trenches;
   forming a first workfunction material layer in the first of the plurality of gate trenches and over the first mask;
   removing a sacrificial portion of the first workfunction material layer and removing the first mask to leave a remaining portion of the first workfunction material layer in the first of the plurality of gate trenches;
   forming a second mask over the plurality of gate trenches, the second mask exposing a second of the plurality of gate trenches and covering remaining ones of the plurality of gate trenches;
   forming a second workfunction material layer in the second of the plurality of gate trenches and over the second mask; and
   removing a sacrificial portion of the second workfunction material layer and removing the second mask to leave a remaining portion of the second workfunction material layer in the second of the plurality of gate trenches.

10. The method of claim 9, wherein forming the first and second masks comprises forming first and second carbon-based hardmasks.

11. The method of claim 9, further comprising: prior to forming the first mask, forming a gate dielectric layer in the plurality of gate trenches.

12. The method of claim 9, further comprising: subsequent to removing the sacrificial portion of the second workfunction material layer and removing the second mask, forming a conductive fill material in the plurality of gate trenches.

13. The method of claim 9, further comprising:
   subsequent to removing the sacrificial portion of the second workfunction material layer and removing the second mask, forming a third mask over the plurality of gate trenches, the third mask exposing a third of the plurality of gate trenches and covering remaining ones of the plurality of gate trenches;

forming a third workfunction material layer in the third of the plurality of gate trenches and over the third mask; and removing a sacrificial portion of the third workfunction material layer and removing the third mask to leave a remaining portion of the third workfunction material layer in the third of the plurality of gate trenches.

14. An integrated circuit structure, comprising:
a first gate electrode over a top and sidewalls of a semiconductor fin, the first gate electrode comprising a first workfunction material layer having a first U-shaped structure;
a second gate electrode over the top and sidewalls of the semiconductor fin, the second gate electrode comprising a second workfunction material layer having a second U-shaped structure, the second workfunction material layer different in composition from the first workfunction material layer, wherein the second gate electrode does not include the first workfunction material layer, and wherein the first gate electrode does not include the second workfunction material layer; and
a third gate electrode over the top and sidewalls of the semiconductor fin, the third gate electrode comprising a third workfunction material layer having a third U-shaped structure, the third workfunction material layer different in composition from the first workfunction material layer and the second workfunction material layer, wherein the third gate electrode does not include the first workfunction material layer and does not include the second workfunction material layer, and wherein the first and second gate electrodes do not include the third workfunction material layer.

15. The integrated circuit structure of claim 14, wherein the first workfunction material layer and the second workfunction material layer are N-type workfunction material layers.

16. The integrated circuit structure of claim 14, wherein the first workfunction material layer and the second workfunction material layer are P-type workfunction material layers.

17. The integrated circuit structure of claim 14, wherein the first workfunction material layer is a P-type workfunction material layer, and the second workfunction material layer is an N-type workfunction material layer.

18. The integrated circuit structure of claim 14, further comprising:
a common conductive fill material above the first workfunction material layer, and above the second workfunction material layer.

19. The integrated circuit structure of claim 14, further comprising:
a common gate dielectric layer below the first workfunction material layer, and below the second workfunction material layer.

* * * * *